United States Patent [19]

Yoneda et al.

[11] Patent Number: 5,615,089
[45] Date of Patent: Mar. 25, 1997

[54] BGA SEMICONDUCTOR DEVICE INCLUDING A PLURALITY OF SEMICONDUCTOR CHIPS LOCATED ON UPPER AND LOWER SURFACES OF A FIRST SUBSTRATE

[75] Inventors: Yoshihiro Yoneda; Takashi Ozawa, both of Kawasaki, Japan

[73] Assignee: Fujitsu Limited, Kawasaki, Japan

[21] Appl. No.: 505,888

[22] Filed: Jul. 24, 1995

[30] Foreign Application Priority Data

Jul. 26, 1994 [JP] Japan .................................. 6-174598

[51] Int. Cl.[6] ......................................................... H05K 1/18
[52] U.S. Cl. .......................... 361/764; 257/723; 257/724; 361/761
[58] Field of Search ................................. 174/52.1–52.4; 257/700, 723, 724, 737, 787, 678, 686; 361/761–764, 782, 813, 820; 437/209, 215, 915; 439/68, 70, 71, 88, 525

[56] References Cited

U.S. PATENT DOCUMENTS

| 5,060,844 | 10/1991 | Behun et al. ....................... 228/180.22 |
| 5,216,278 | 6/1993 | Lin et al. ................................. 257/688 |
| 5,241,133 | 8/1993 | Mullen, III et al. ..................... 174/52.4 |
| 5,297,006 | 3/1994 | Mizukoshi .............................. 361/764 |
| 5,473,190 | 12/1995 | Inoue et al. ............................. 257/691 |
| 5,519,176 | 5/1996 | Goodman et al. ...................... 361/794 |

FOREIGN PATENT DOCUMENTS

| 60-117763 | 6/1985 | Japan ..................................... 257/724 |
| 4-219966 | 8/1992 | Japan ..................................... 257/723 |
| 5-48000 | 2/1993 | Japan ..................................... 257/723 |
| 6-29422 | 2/1994 | Japan ..................................... 257/723 |

*Primary Examiner*—Donald Sparks
*Attorney, Agent, or Firm*—Armstrong, Westerman, Hattori, McLeland & Naughton

[57] ABSTRACT

A semiconductor device includes a first substrate carrying semiconductor chips on both upper and lower major surfaces thereof, a second substrate carrying the first substrate, and a resin package body having a first part for embedding the semiconductor chips on the upper major surface of the first substrate and a second part for embedding the semiconductor chips on the lower major surface of the first substrate, wherein the second substrate carries on a lower major surface thereof solder bumps forming a BGA structure.

14 Claims, 7 Drawing Sheets

BGA SEMICONDUCTOR DEVICE INCLUDING A PLURALITY OF SEMICONDUCTOR CHIPS LOCATED ON UPPER AND LOWER SURFACES OF A FIRST SUBSTRATE

BACKGROUND OF THE INVENTION

1. Field of the Invention

The present invention generally relates to semiconductor devices and more particularly to a semiconductor device that has a BGA (ball grid array) structure.

2. Description of the Related Art

With the demand for high speed, high performance and low cost, semiconductor devices are continuously increasing in integration density. In order to meet the intense demand for increased integration density in particular, various package structures have been proposed, including a QFP (quad flat package) structure as well as the BGA structure mentioned before, wherein a QFP device uses a flat resin package body having interconnection leads projecting laterally from a circumferential edge of the package body. In a BGA device, on the other hand, metal spheres or balls are provided on a bottom surface of a Dackage body as electrodes. By arranging the metal balls in rows and columns, it is possible to increase the number of the electrodes even when the size of the package body is small.

Figure 1:
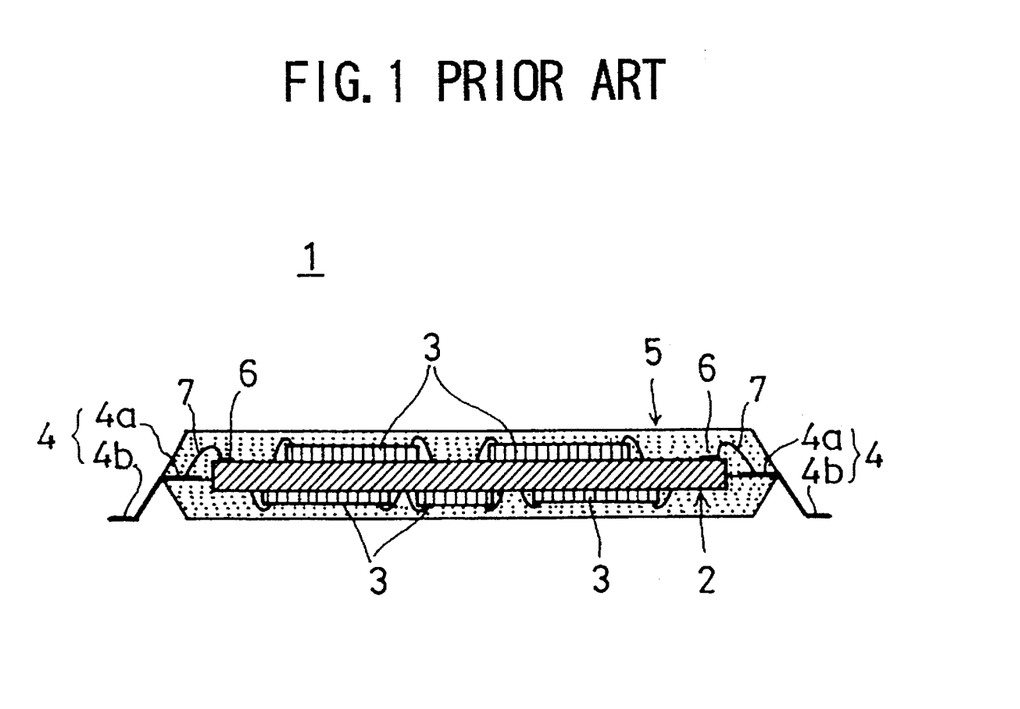
FIG. 1 is a diagram showing the construction of a conventional semiconductor device having the QFP structure.

FIG.1 shows the construction of a typical QFP device 1, wherein the device 1 includes a package substrate 2 carrying thereon a plurality of semiconductor chips 3 on upper and lower major surfaces 2a and 2b. The package substrate 2 may be formed of a ceramic, and is encapsulated in a flat resin package body 5, wherein a number of interconnection leads 4 are provided at the peripheral edge of the package body 5. Each of the interconnection leads 4 is formed of an inner lead part 4a held within the resin package body 5 and an outer lead part 4b projecting outside the package body 5. The inner lead part 4a is connected to a conductor pattern 6 provided on the package substrate 2 by means of a bonding wire 7. The bonding wire 7 is also encapsulated in the resin package body 5. Further, the outer lead part 4b of the interconnection lead 4 is bent in the downward direction in the vicinity of the peripheral edge of the package body 5 to form a gull wing structure, wherein there is formed a part laterally bent at the distal end of the outer lead part 4b for contacting with a wiring pattern provided on a printed circuit board. Thus, the QFP device of FIG.1 is suitable for mounting using the art of SMT (surface mounting technology).

In the semiconductor device 1, it is possible to mount the semiconductor chips 3 on both the upper and lower major surfaces of the package substrate 2 as already noted. Thus, the device 1 is advantageous for increasing the density of mounting of the chips on a package substrate. On the other hand, such a construction of increased number of chips on a single chip substrate raises a problem in that the number of the leads 4 extending from the resin package body 5 increases significantly. With such an increase in the number of the leads 4, the pitch between the leads 4 has to be correspondingly reduced. Further, each lead has to have a reduced width. Thereby, the leads 4 become fragile and easily cause a short circuit when the device 1 is mounted upon a printed circuit board. In addition, high precision is required when mounting such a high density semiconductor device upon a printed circuit board.

Figure 2:
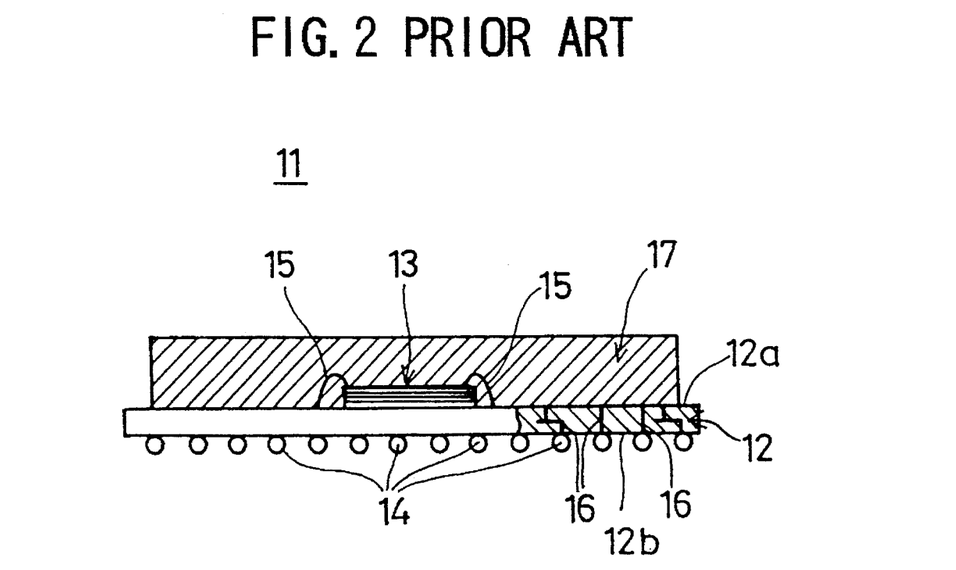
FIG. 2 is a diagram showing the construction of a conventional semiconductor device having the BGA structure.

FIG. 2 shows the construction of a conventional BGA device 11 that overcomes the foregoing problem of QFP device, wherein the illustrated device 11 has a plastic package body as will be described later.

Referring to FIG. 2, the BGA device 11 includes a printed circuit board 12 of a multiple layer structure, wherein the printed circuit board 12 has an upper major surface 12a on which a single semiconductor chip 13 is mounted by a die bonding process, and the like. Further, the printed circuit board 12 has a lower major surface 12b on which a plurality of solder bumps 14 are formed for external connection. Corresponding to each of the solder bumps 14, there is provided a through hole 16 in the printed circuit board 12, wherein the through holes 16 are connected to a wiring pattern (not shown) provided on the upper major surface 12a of the printed circuit board 12. Further, the printed circuit board 12, having a multiple layer construction as noted before, may include a plurality of such wiring patterns in a plurality of layers, each in electrical connection with a through hole 16. Thereby, the wiring pattern or patterns on the surface 12a of the printed circuit board 12 are connected to the semiconductor chip 13 by way of bonding wires 15. The semiconductor chip 13, the bonding wires 15 and the wiring patterns are encapsulated in a resin package body 17.

In the BGA device 11 of FIG. 2, an increase in the number of external connections is easily accomplished by increasing the number of the solder bumps 14 that may be provided on the entire bottom surface 12b of the printed circuit board 12, without reducing the pitch between the solder bumps 14. On the other hand, the BGA device 11 has a disadvantage in that the side of the printed circuit board 12 that can carry the semiconductor chip 13 is limited to the surface 12a. It has not been possible to provide the semiconductor chip 13 on both the upper and lower major surfaces 12a and 12b of the printed circuit board 12.

SUMMARY OF THE INVENTION

Accordingly, it is a general object of the present invention to provide a semiconductor device wherein the foregoing problems are eliminated.

Another and more specific object of the present invention is to provide a semiconductor device having a package structure suitable for increasing the number of semiconductor chips mounted upon a common package substrate, without excessively reducing the pitch of the leads used for external connection.

Another object of the present invention is to provide a semiconductor device, comprising:

a plurality of semiconductor chips;

a first substrate having upper and lower major surfaces, said first substrate carrying said semiconductor chips on both of said upper and lower major surfaces;

a first interconnection pattern provided on said first substrate, said first interconnection pattern being connected to said semiconductor chips electrically;

a second substrate carrying thereon said first substrate, said second substrate having a lower major surface;

a plurality of solder bumps provided on said lower major surface of said second substrate;

a second interconnection pattern provided on said second substrate for connecting said first interconnection pattern to said solder bumps electrically; and a resin package body provided on said upper and lower major surfaces of said first substrate so as to encapsulate therein said plurality of semiconductor chips and said first and second interconnection patterns;

said second substrate defining a space such that said semiconductor chip provided on said lower major surface of said first substrate is accommodated in said space.

According to the present invention, it is possible to mount a number of semiconductor chips on a package substrate while using the BGA package structure. As a result of use of the BGA package, it should be noted that the present invention can easily attend to the necessary increase in the number of leads even when the number of the semiconductor chips in the package is increased.

Further, one may provide a conductor pattern having a large surface area on a support surface, which is formed on the second substrate for supporting the first substrate thereon, as a power conductor pattern. Thereby, the power conductor pattern on the foregoing support surface is electrically connected to one or more of the solder bumps via a conductor pattern or via-hole that penetrates through the second substrate. As such a support surface is generally formed so as to surround the space mentioned before, the power conductor pattern can have a very large surface area suitable for carrying large electric power for driving a number of semiconductor chips provided on the first substrate.

By providing the power conductor pattern on such a support surface, the electrical interconnection for supplying electric power from the second substrate to the first substrate is achieved easily by providing a conductive adhesive such as a silver paste, such that the conductive adhesive connects the power conductor pattern on the support surface to a corresponding power conductor pattern provided on the lower major surface of the first substrate. The power conductor pattern thereby forms a part of the first interconnection means. As a result, the first substrate is fixed firmly upon the second substrate by the conductive adhesive.

In such a construction, it should also be noted that the conductor patterns on the upper major surface of the substrate, provided as a part of the first interconnection means for carrying signals, are easily connected to corresponding conductor patterns provided on the second substrate as the second interconnection means, by means of wire bonding process, as the number of the electrode pads on the upper major surface of the first substrate is reduced to about one-half due to the provision of the power electrode pads and the ground pads solely on the lower major surface of the first substrate.

Other objects and further features of the present invention will become apparent from the following detailed description when read in conjunction with the attached drawings.

DETAILED DESCRIPTION OF PREFERRED EMBODIMENTS

Figure 3:
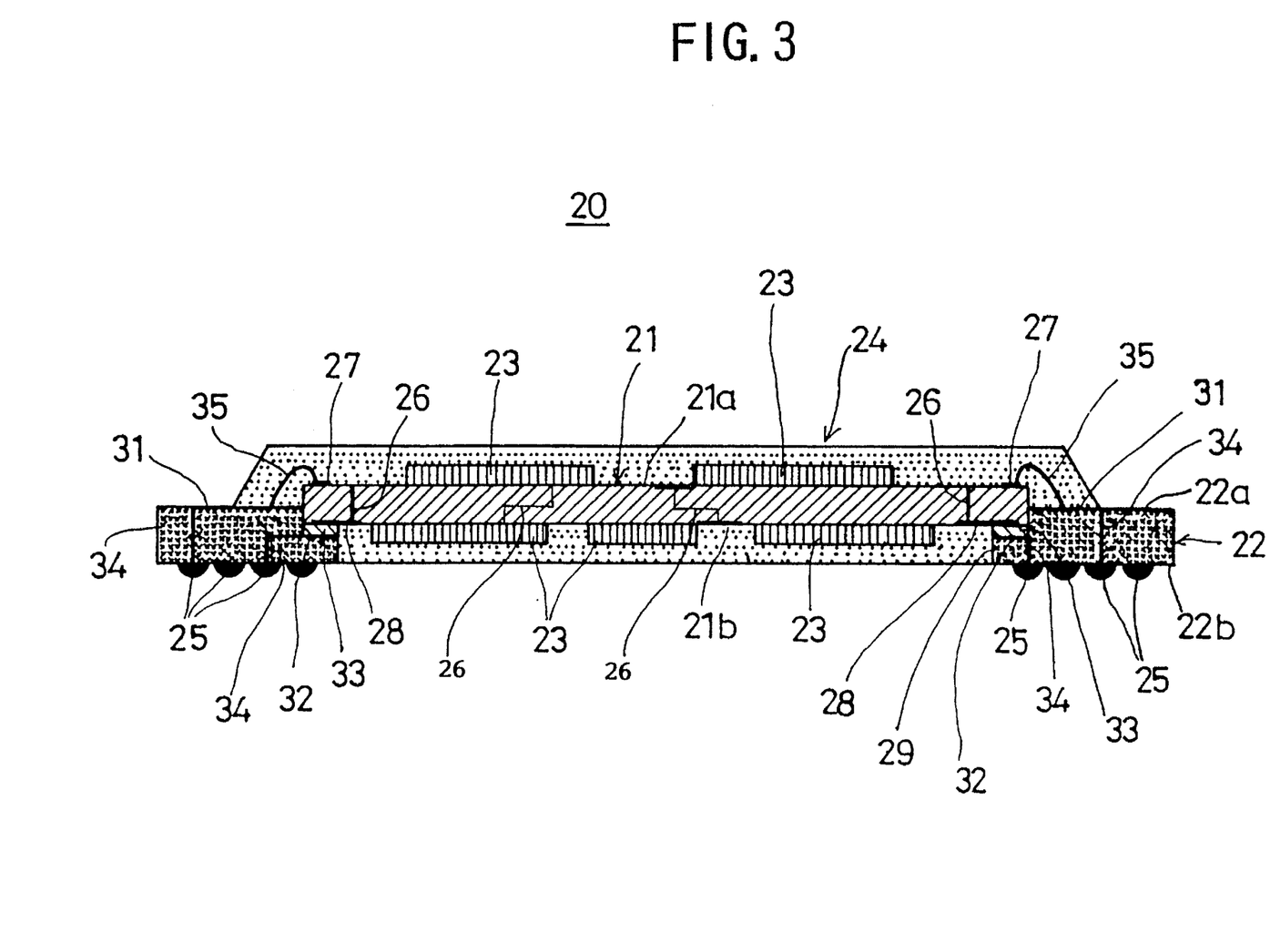
FIG. 3 is a diagram showing the construction of a semiconductor device according to a first embodiment of the present invention.
Figure 4:
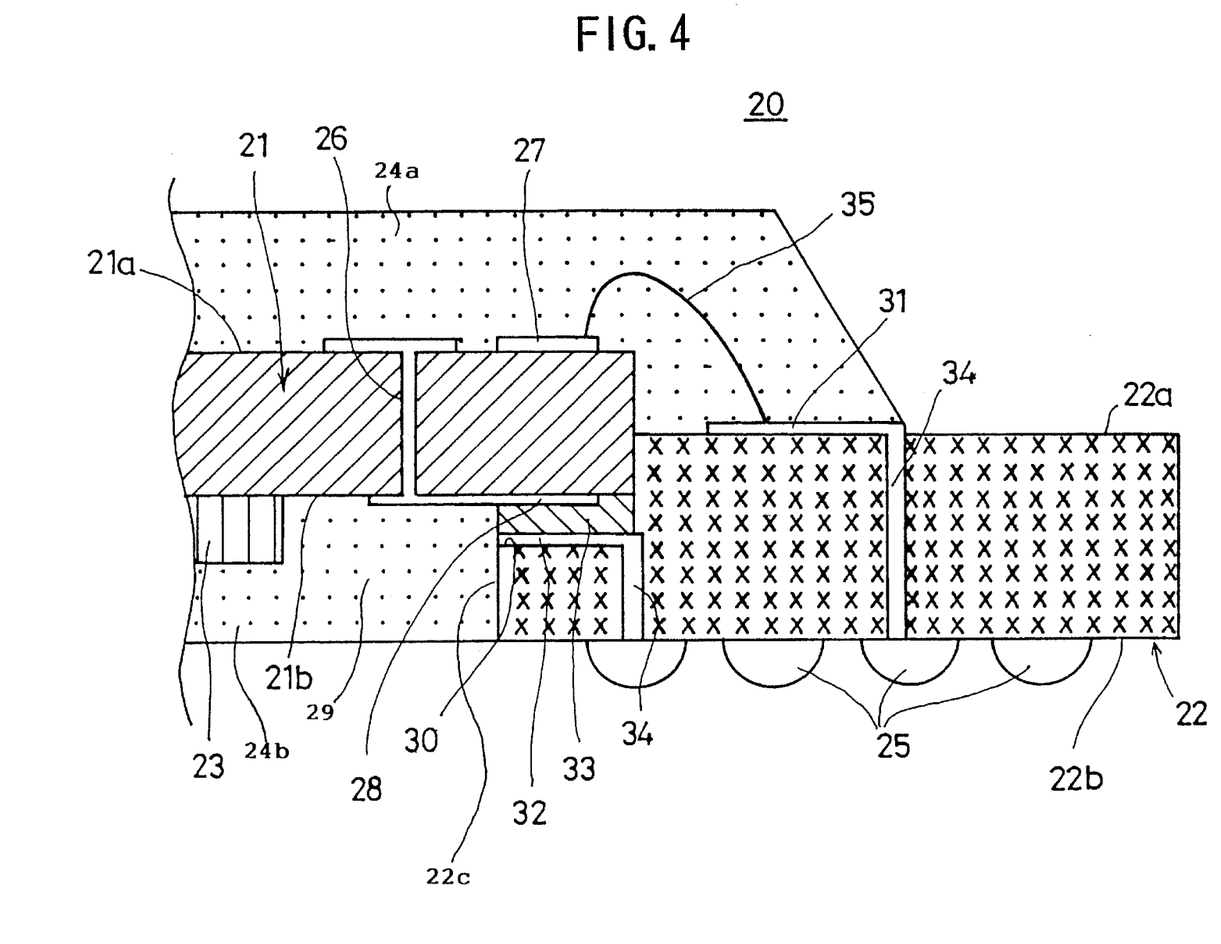
FIG. 4 is a diagram showing the semiconductor device of FIG. 3 in an enlarged scale.

FIGS. 3 and 4 show a semiconductor device 20 according to a first embodiment of the present invention, wherein FIG. 3 shows the semiconductor device 20 in an elevational cross sectional view while FIG. 4 shows a part of the semiconductor device 20 in an enlarged scale.

Referring to FIG. 3, the semiconductor device 20 includes a first substrate 21 referred to hereinafter as "intermediate substrate" and a second substrate 22 referred to hereinafter as "mount substrate," wherein the mount substrate 22 carries thereon the aforementioned intermediate substrate 21. The intermediate substrate 21, in turn, carries a plurality of semiconductor chips 23 on both of upper and lower major surfaces 21a and 21b thereof, while the mount substrate 22 carries, on a lower major surface 22b thereof, a plurality of solder bumps 25 that form a BGA structure. The intermediate substrate 21 may be formed of a multi-layer ceramic board, and carries, on the upper and lower major surfaces 21a and 22b as well as on an internal layer provided inside the substrate 21, wiring patterns (not illustrated) in a state that the wiring patterns are connected to the semiconductor chips 23 on the substrate 21. Further, the wiring patterns are connected, on the substrate 21, with each other by interconnection patterns 26 embedded in the substrate 21 including via holes. See FIG. 4

It should be noted that the intermediate substrate 21 carries, on the upper and lower major surfaces 21a and 21b thereof, a number of terminal pads 27 and 28, such that the terminal pads 27 and 28 are disposed, respectively on the upper and lower major surfaces 21a and 21b, along an outer periphery of the substrate 21, wherein each of the terminal pads 27 and 28 are connected to one or more of the semiconductor chips 23, via the wiring patterns provided on the upper and lower major surfaces 21a and 21b of the substrate 21 as well as via the via-holes 26 penetrating through the substrate 21.

The foregoing terminal pads 27 and 28 generally include signal terminal pads for carrying signals, power terminal pads for carrying electric power, and ground terminal pads used for connection to the ground. Generally, about 60% of the total terminal pads in an integrated circuit are used for the signal terminal pad, while about 40% are used either for the power terminal pad or for the ground pad.

Thus, in the present embodiment shown in FIG. 3 and 4, most or all of the power terminal pads and the ground pads are provided on the lower major surface 21b of the substrate 21 in the form of the terminal pads 28 as indicated in FIG. 4. Further, most or all of the signal terminal pads are provided on the upper major surface 21a in the form of the terminal pads 27.

As a result of such a construction, it is possible to reduce the number of the signal terminal pads 27 provided on the upper major surface 21a of the substrate 21 as compared with the construction in which the terminal pads are provided only on one side of the substrate, by about one-half. Associated therewith, the distance between adjacent terminal pads increases, and the wire bonding or other interconnection process to the terminal pads 27 is achieved easily and efficiently by using a commercially available, ordinary wire bonder.

In the illustrated example of FIG. 4, it will be noted that the terminal pads 27 on the upper major surface 21a of the intermediate substrate 21 are connected to respective, corresponding signal electrodes 31 that are provided on an upper major surface 22a of the mount substrate 22, by bonding wires 35. The mount substrate 22 is typically formed of a multiple-layer printed circuit board of an insulating material such as a BT resin, and the solder bumps 25 on the lower major surface 22b as already noted. The solder bumps 25 are connected, in the mount substrate 22, to the corresponding signal electrode pads 31 on the upper major surface 21a by respective via-holes 34 that penetrate through the substrate 22 from the upper major surface 22a to the lower major surface 22b.

It should be noted that the mount substrate 22 forms a frame structure defined by an inner peripheral wall 22c, wherein the inner peripheral wall 22c defines a central space region 29 at the central part of the frame structure. The central space region 29 may be formed by a milling process, while the mount substrate 22 is further formed with a support surface 30 extending along the inner peripheral wall 22c as a recessed upper major surface. The support surface 30 supports thereon the intermediate substrate 21.

In more detail, the support surface 30 carries thereon an electrode pad 32 connected to one of the solder bumps 25 via a corresponding via-hole 34, and the power terminal pad 28 on the lower major surface 21b of the intermediate substrate 21 is connected to the corresponding electrode pad 32 on the support substrate 30 by means of a bonding layer 33 of a conductive resin such as silver paste, upon mounting of the intermediate substrate 21 on the mount substrate 22. In other words, the intermediate substrate 21 is held upon the mount substrate 22 firmly by the conductive resin layer 33 with the electric connection that supplied electric power.

It should be noted that the semiconductor chips 23 on the upper major surface 21a of the intermediate substrate 21 as well as any terminal pads 27 and wires 35 are encapsulated in a resin package body 24a that forms an upper-half part of a resin package body 24 shown in FIG. 3. Further, a similar resin package body 24b is provided on the lower major surface 21b of the substrate 21 as a lower-half part of the resin package body 24, such that the resin package body 24b fills the space region 29 and encapsulates the semiconductor chips 23 on the lower major surface 21b as well as the electrode terminals 28 thereon.

More specifically, the semiconductor chips 23 mounted upon the lower major surface 21b of the intermediate substrate 21 are accommodated in the space region 29 in the state where the top surface of the semiconductor chips 23 which is the surface opposite the surface of the chip 23 contacting to the lower major surface 21b, is located closer to the lower major surface 21b with respect to the lower major surface 22b of the mount substrate 22b. Thereby, the semiconductor chips 23 on the lower major surface 21b do not become an obstacle in the SMT process of the semiconductor device 20 on a printed circuit board.

In such a construction, one can provide the power terminal pad 28 as well as the ground pad (not illustrated) on the lower major surface 21b of the intermediate substrate 21 with a substantial length and width that are sufficient for carrying the electric power necessary for driving the semiconductor chips 23 that are provided on both the upper and lower major surfaces of the intermediate substrate 21.

In the semiconductor device 20, the solder bumps 25 on the lower major surface 22b of the mount substrate 22 form a BGA structure. In other words, by employing the semiconductor device 20, it is possible to secure a sufficient pitch for the solder bumps 25 even when the number of the solder bumps 25 is increased in correspondence to the mounting of plural semiconductor chips 23 on the substrate 21. Thus, the semiconductor device 20 facilitates the efficiency of mounting process substantially. As will be noted easily, the semiconductor device 20 having such a BGA structure is suitable for efficient surface mounting according to the SMT process.

In fabricating the semiconductor device 20, it is preferable to form the resin package body 24 by a transfer molding process of a thermoplastic resin. As the semiconductor chips 23 are provided on both the upper and lower major surfaces 21a and 21b of the intermediate substrate 21, the stress applied to the semiconductor chips 23 at the time of molding is equilibrated in the upper major surface 21a and in the lower major surface 21b. Thereby, a problem such a developing of cracks in the resin package body is successfully minimized, and the semiconductor device 20 has a preferable feature of improved reliability. Such a molding of the resin package body 24 is of course conducted after the intermediate substrate 21 is mounted upon the mount substrate 22.

Figure 5:
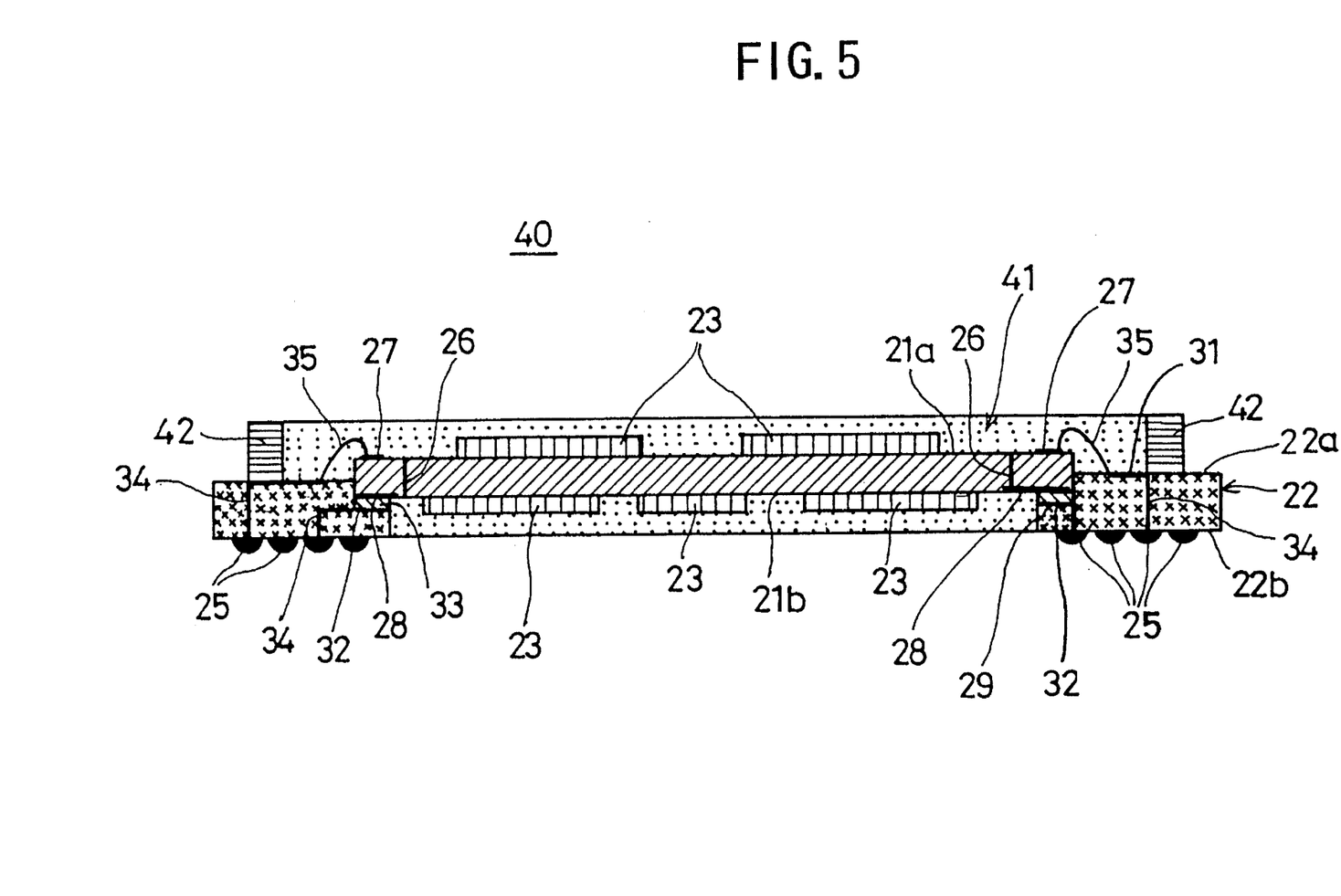
FIG. 5 is a diagram showing a modification of the semiconductor device of FIG. 3.

FIG. 5 shows the construction of a semiconductor device 40 as a modification of the semiconductor device 20. Thus, in FIG. 5, those parts described previously are designated by the same reference numerals and the description thereof will be omitted.

Referring to FIG. 5, the semiconductor device 40 includes a resin package body 41 formed of potting rather than transfer molding. Thus, in order to hold the molten resin in the shape of the resin package to be formed, the semiconductor device 40 uses a dam 42 on the upper major surface 22a of the mount substrate 22 such that the dam 42 surrounds laterally the area where an upper-half part of the resin package body 41 is to be formed. Thereby, the upper-half part of the resin package body 41 is successfully formed on the upper major surface 21a of the mount substrate 21.

On the lower major surface 21b of the substrate 21, on the other hand, a resin region is formed to fill the space region 29, defined by the inner peripheral wall 22c of the mount substrate 22, as a lower-half part of the resin package body 41. In this case, the inner peripheral wall 22c acts as the stopper of the molten resin.

By using the potting for the formation of the resin package body, it is possible to eliminate the mold used in the transfer molding process. Thereby, the fabrication cost of the device is reduced. In the present embodiment, too, the problem of cracking of the resin package body 41 is minimized by providing the resin package body on the both sides of the intermediate substrate 21. Further, application of stress to the semiconductor chips 23 is substantially reduced.

In the present invention, it should be noted the fixing of the intermediate substrate 21 upon the support surface 30 of the mount substrate 22 is by no means limited to the conductive bonding layer 33 shown in FIG. 4. Instead, one may provide a solder bump in place of the terminal pad 28 and carry out a face-down mounting such that the solder bump fused upon the electrode pad 32 provided on the support surface 30. Further, electrical connection between the terminal pad 28 and the electrode pad 32 may be achieved also by wire bonding. Further, any of ceramic substrate and multiple-layer printed circuit board may be used for the substrates 21 and 22. Further, it is also possible to provide the power and ground terminals on the upper major surface of the substrate 21 and the signal terminals on the lower major surface of the substrate 21.

Figure 6:
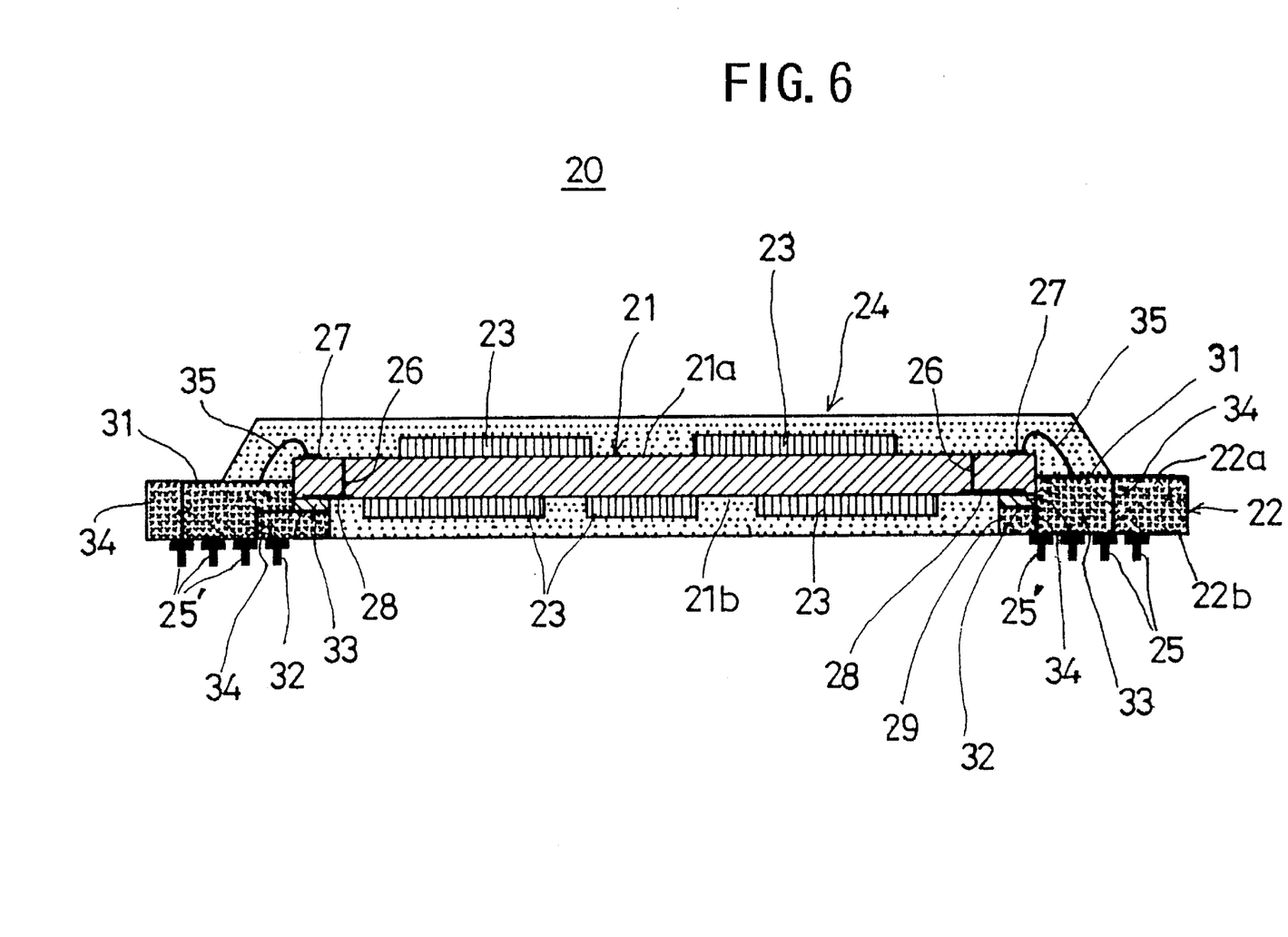
FIG. 6 is a diagram showing another modification of the device of FIG. 3.
Figure 7:
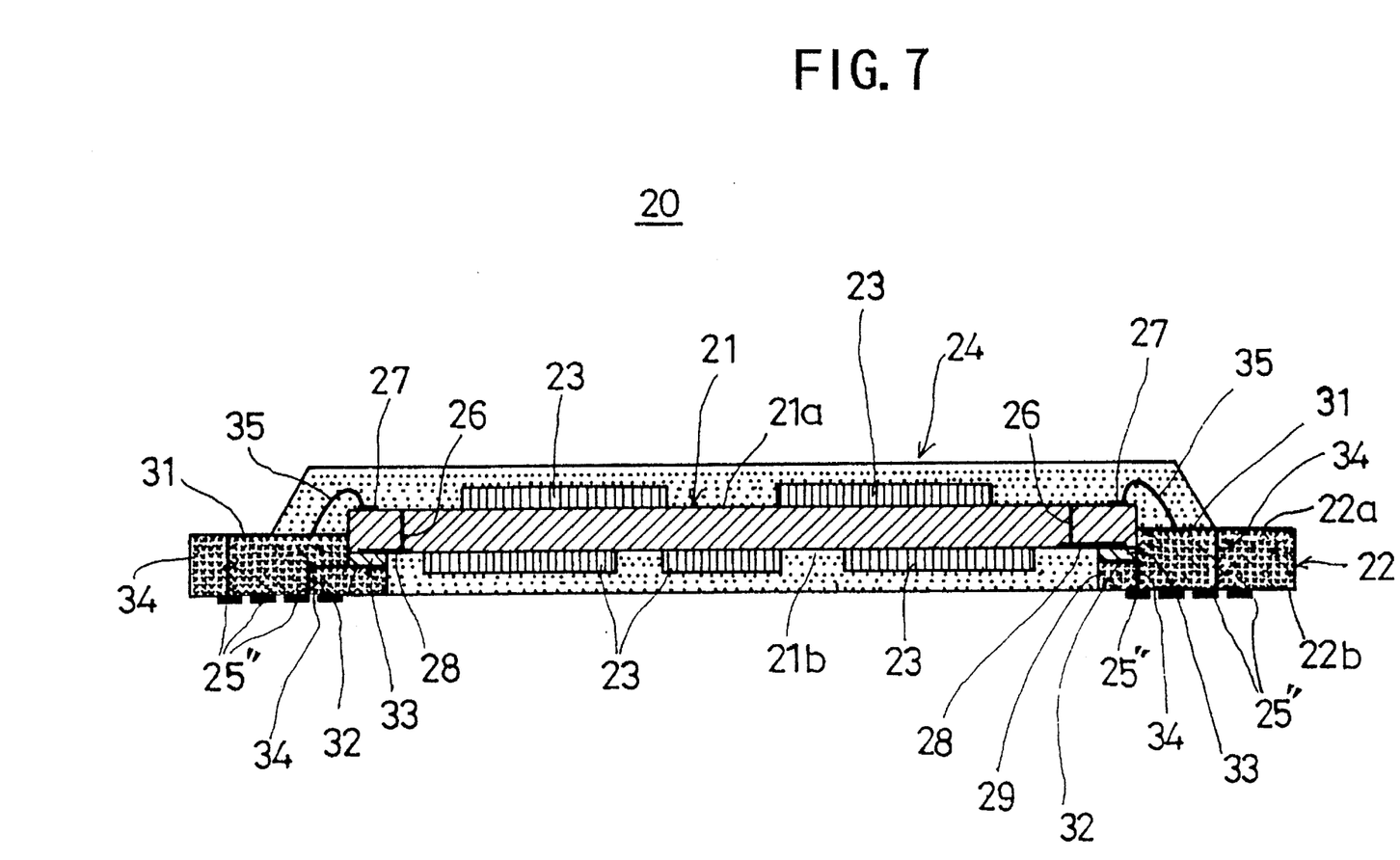
FIG. 7 is a diagram showing a further modification of the device of FIG. 3.

FIGS. 6 and 7 show various modifications of the first embodiment of the present invention, wherein those parts described previously are designated by the same reference numerals and the description thereof will be omitted.

In the modification of FIG. 6, the solder bumps 25 are replaced by electrode pins 25' that extend downwardly from the lower major surface of the mount substrate 22. On the other hand, the modification of FIG. 7 replaces the solder bumps 25 by electrode lands 25". In any of these embodiments, the desirable effect of the present invention is achieved.

Figure 8:
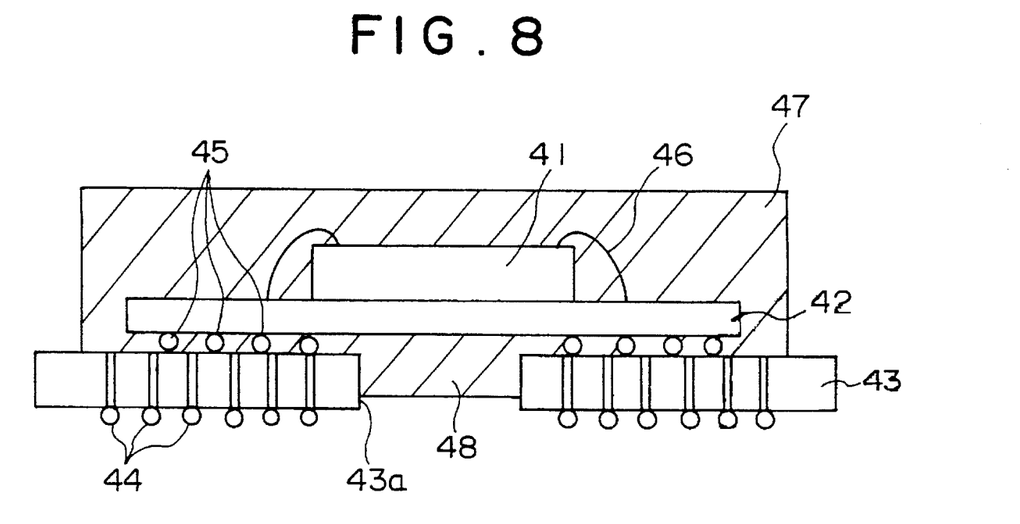
FIG. 8 is a diagram showing the construction of a semiconductor device according to a second embodiment of the present invention.

FIG. 8 shows a second embodiment of the present invention, wherein a single semiconductor chip 41 is mounted upon an intermediate substrate 42 by means of bonding wires 46 or tape lead not illustrated, wherein the intermediate substrate 42 is mounted upon a mount substrate 43 by means of solder bumps 45. The mount substrate 43 in turn carries an array of solder bumps 44 on the lower major surface thereof for connection to a printed circuit board and further a resin package body 47 on an upper major surface thereof such that the resin package body 47 covers the semiconductor chip 41 and the intermediate substrate 42. Further, a low viscosity resin is introduced into the gap between the intermediate substrate 43 and the mount substrate 43 from an opening 43a provided on the mount substrate 43 to form a second resin body 48.

Figure 9:
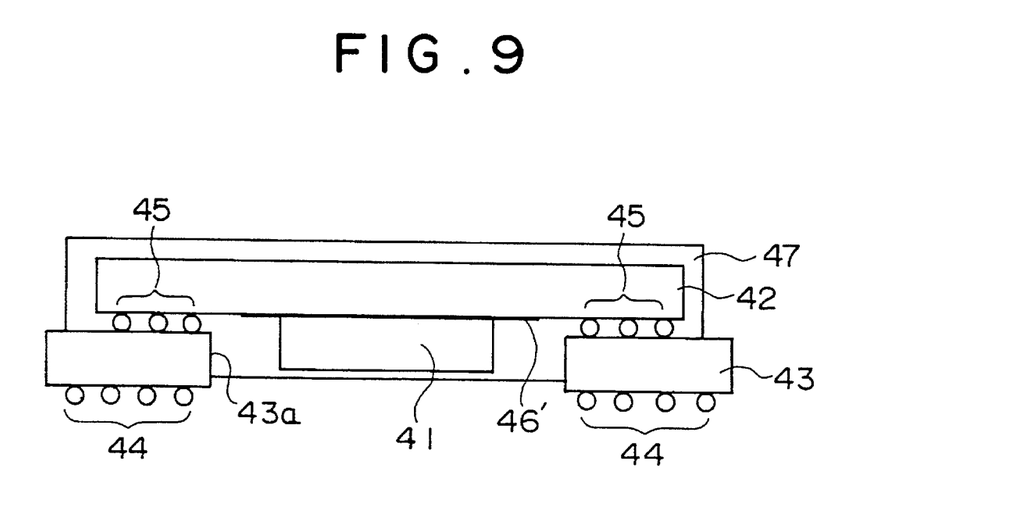
FIG. 9 is a diagram showing a modification of the semiconductor device of FIG. 8.

FIG. 9 shows a modification of the device of FIG. 8, wherein the semiconductor chip 41 is now provided on the lower major surface of the intermediate substrate 42. Thereby, the semiconductor chip 41 is accommodated in a space defined by the opening 43a of the mount substrate 43. By constructing the semiconductor device as such, it is possible to reduce the height or thickness of the device. In the modification of FIG.9, the interconnection between the semiconductor chip 41 and the intermediate substrate 42 is achieved by a tape lead 46'.

Further, the present invention is not limited to the embodiments described heretofore, but various variations and modifications may be made without departing from the scope of the invention.

What is claimed is:

1. A semiconductor device, comprising:

a plurality of semiconductor chips;

a first substrate having upper and lower major surfaces, said first substrate carrying said semiconductor chips on both of said upper and lower major surfaces;

a first interconnection pattern provided on said first substrate, said first interconnection pattern being electrically connected to said semiconductor chips;

a second substrate carrying thereon said first substrate, said second substrate having a lower major surface;

electrode means provided on said lower major surface of said second substrate for external connection;

a second interconnection pattern provided on said second substrate for electrically connecting said first interconnection pattern to said electrode means; and a resin package body provided on said upper and lower major surfaces of said first substrate so as to encapsulate therein said plurality of semiconductor chips and said first and second interconnection patterns, said second substrate defining a space such that said semiconductor chip provided on said lower major surface of said first substrate is accommodated in said space, said first interconnection pattern comprises a first wiring part provided on one of said upper and lower major surfaces of said first substrate and a second wiring part provided on the other of said upper and lower major surfaces of said first substrate, and only one of said first wiring part and said second wiring part carries electric power for said plurality of chips.

2. A semiconductor device as claimed in claim 1, wherein said first wiring part carries electric signals, and said second wiring part carries electric power for said plurality of chips.

3. A semiconductor device as claimed in claim 2, wherein each of said first and second wiring parts includes a terminal pad region, wherein said terminal pad region forming said second wiring part has an area larger than an area of said terminal pad region forming said first wiring part.

4. A semiconductor device as claimed in claim 1, wherein said second interconnection pattern includes an electrode pad provided on a support surface formed on said second substrate for supporting thereon said first substrate and a conductive interconnection member provided on said electrode pad, said interconnection member contacting with a corresponding electrode pad provided on said lower major surface of said first substrate as a part of said first interconnection pattern.

5. A semiconductor device as claimed in claim 4, wherein said conductive member comprises a conductive resin layer.

6. A semiconductor device as claimed in claim 1, wherein said second substrate has a form of a frame having a central opening penetrating from an upper major surface to said lower major surface of said second substrate, said first substrate being supported upon said second substrate, such that said semiconductor chip mounted upon said lower major surface of said first substrate is accommodated in said central opening.

7. A semiconductor device as claimed in claim 6, wherein said second substrate has a support surface along an inner periphery defining said central opening, as a recessed upper major surface, said second substrate supporting said first substrate at said support surface.

8. A semiconductor device as claimed in claim 6, wherein said semiconductor chip on said lower major surface of said first substrate has a top surface that is a surface opposite to a surface of said semiconductor chip contacting with said lower major surface of said first semiconductor chip, such that said top surface is formed at a level closer to a level of said lower major surface of said first substrate as compared with said lower major surface of said second substrate.

9. A semiconductor device as claimed in claim 6, wherein said central opening is filled by a resin that forms a lower part of said package body, for a region located below said lower major surface of said first substrate such that said semiconductor chip on said lower major surface of said first substrate is embedded in said lower part of said package body.

10. A semiconductor device as claimed in claim 1, wherein said electrode means comprises an array of solder bumps projecting from said lower major surface of said second substrate.

11. A semiconductor device as claimed in claim 1, wherein said electrode means comprises an array of electrode pins each projecting from said lower major surface of said second substrate.

12. A semiconductor device as claimed in claim 1, wherein said electrode means comprises an array of electrode lands.

13. A semiconductor device, comprising:

a semiconductor chip;

a first substrate having upper and lower major surfaces, said first substrate carrying said semiconductor chips on one of said upper and lower major surfaces;

a first interconnection pattern provided on said first substrate, said first interconnection pattern being electrically connected to said semiconductor chips;

a second substrate carrying thereon said first substrate, said second substrate having a lower major surface;

a plurality of solder bumps provided on said lower major surface of said second substrate;

a second interconnection pattern provided on said second substrate for electrically connecting said first interconnection pattern to said solder bumps; and a resin package body provided on said upper and lower major surfaces of said first substrate so as to encapsulate therein said semiconductor chip and said first and second interconnection patterns, said first interconnection pattern comprises a first wiring part provided on one of said upper and lower major surfaces of said first substrate and a second wiring part provided on the other of said upper and lower major surfaces of said first substrate, and only one of said first wiring part and said second wiring part carries electric powers for said plurality of chips.

14. A semiconductor device as claimed in claim 13, wherein said second substrate defines a space such that said semiconductor chip provided on said lower major surface of said first substrate is accommodated in said space.

* * * * *